(12) United States Patent
Higano et al.

(10) Patent No.: US 10,367,048 B2
(45) Date of Patent: Jul. 30, 2019

(54) DISPLAY DEVICE AND METHOD OF MANUFACTURING THE SAME

(71) Applicant: Japan Display Inc., Minato-ku (JP)

(72) Inventors: Toshiyuki Higano, Tokyo (JP); Emi Higano, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/810,205

(22) Filed: Nov. 13, 2017

(65) Prior Publication Data

US 2018/0138257 A1    May 17, 2018

(30) Foreign Application Priority Data

Nov. 14, 2016  (JP) ................................. 2016-221748

(51) Int. Cl.
| | |
|---|---|
| *H01L 27/14* | (2006.01) |
| *H01L 27/32* | (2006.01) |
| *H01L 51/52* | (2006.01) |
| *H01L 51/00* | (2006.01) |
| *H01L 51/56* | (2006.01) |

(52) U.S. Cl.
CPC ...... *H01L 27/3262* (2013.01); *H01L 27/3244* (2013.01); *H01L 27/3258* (2013.01); *H01L 51/0024* (2013.01); *H01L 51/5253* (2013.01); *H01L 51/5271* (2013.01); *H01L 51/5246* (2013.01); *H01L 51/56* (2013.01); *H01L 2251/568* (2013.01)

(58) Field of Classification Search
CPC ............. H01L 27/3262; H01L 27/3258; H01L 51/5271; H01L 51/56
USPC ................................................ 257/40, 59, 72
See application file for complete search history.

(56) References Cited

U.S. PATENT DOCUMENTS

| | | | |
|---|---|---|---|
| 7,928,656 B2 * | 4/2011 | Imamura ................ | H05B 33/04 313/504 |
| 9,444,076 B2 * | 9/2016 | No ...................... | H01L 51/5293 |
| 2016/0268358 A1 | 9/2016 | Ito et al. | |

FOREIGN PATENT DOCUMENTS

JP          2016-167400          9/2016

* cited by examiner

*Primary Examiner* — Tan N Tran
(74) *Attorney, Agent, or Firm* — Oblon, McClelland, Maier & Neustadt, L.L.P.

(57) ABSTRACT

According to one embodiment, a display device includes a first insulating substrate, an emitting layer, a protective film, a resin base, a first adhesive layer, and a second adhesive layer. The first insulating substrate includes a display area and a drive area. The emitting layer is in the display area. The protective film covers the emitting layer. The resin base is at a position upper than the protective film. The first adhesive layer is under the resin base, in the display area and the drive area. The second adhesive layer is on the resin base. The second adhesive layer covers the drive area and an end portion of the resin base. The resin base is located between the first adhesive layer and the second adhesive layer in the drive area.

9 Claims, 18 Drawing Sheets

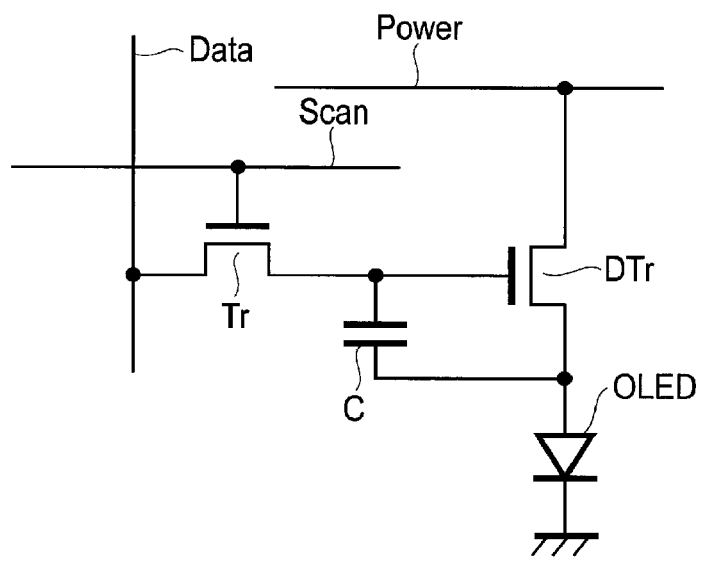
F I G. 2

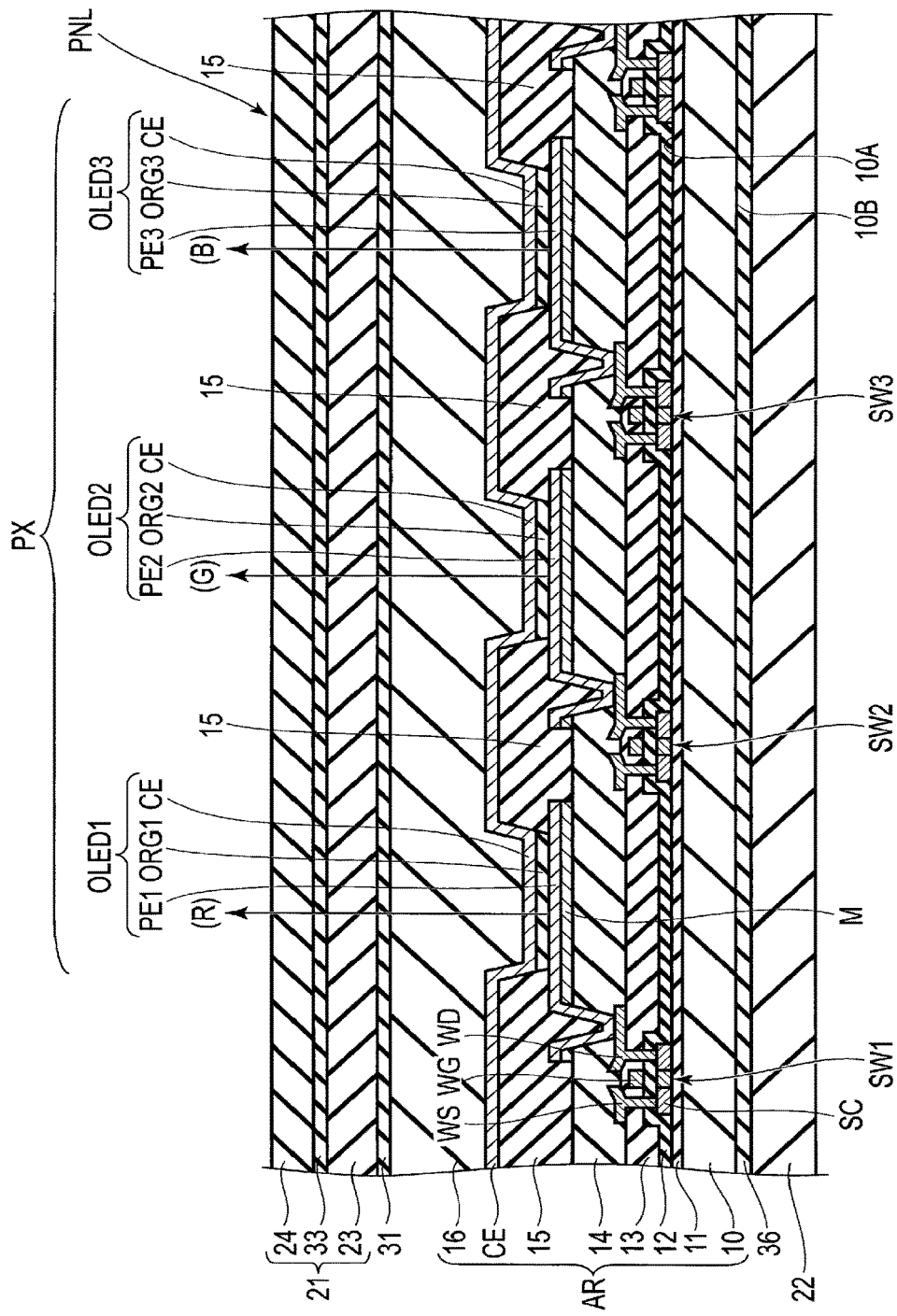
F I G. 3

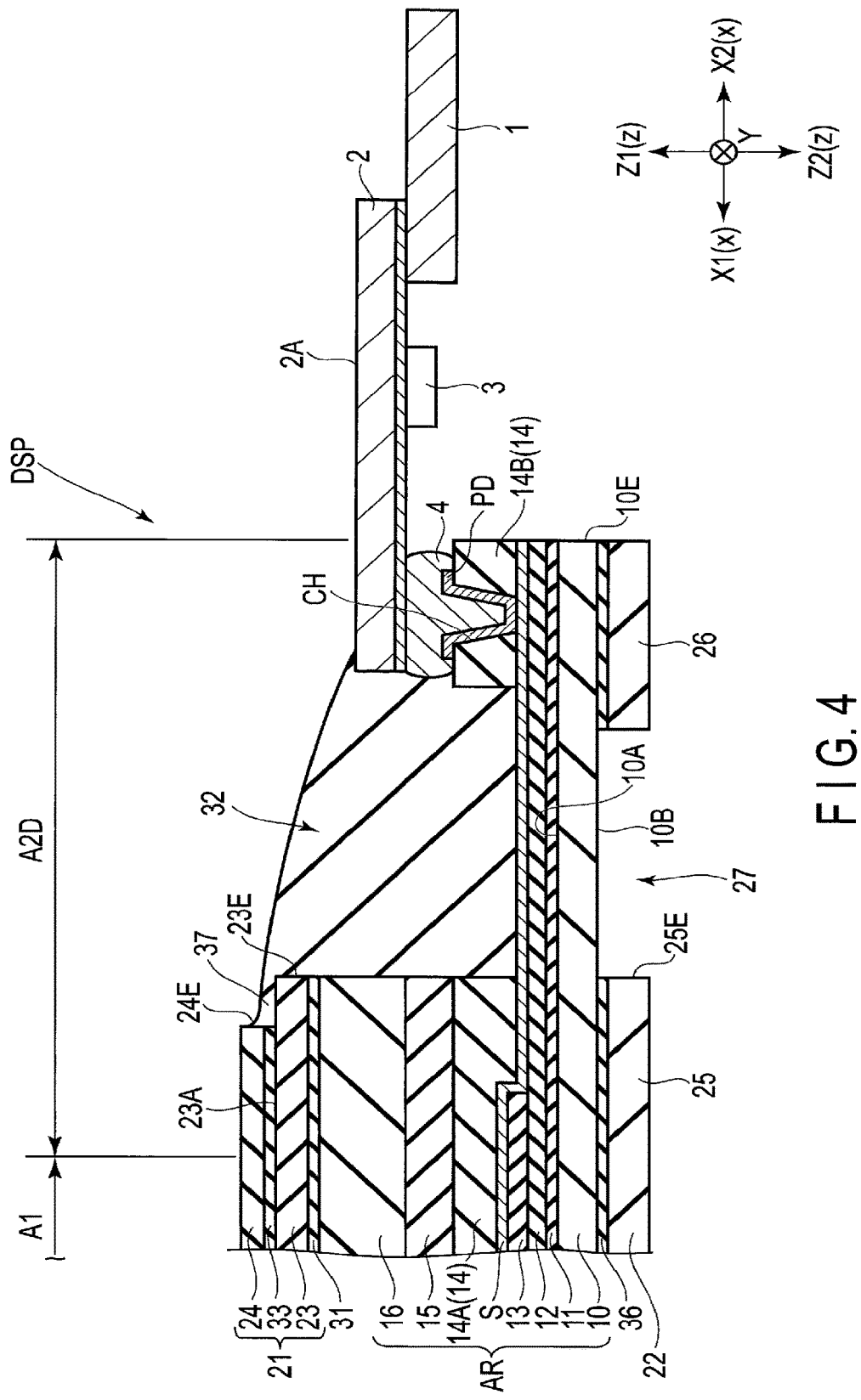
F I G. 4

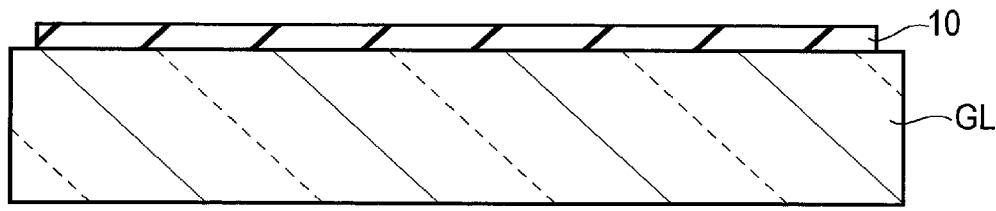
F I G. 5
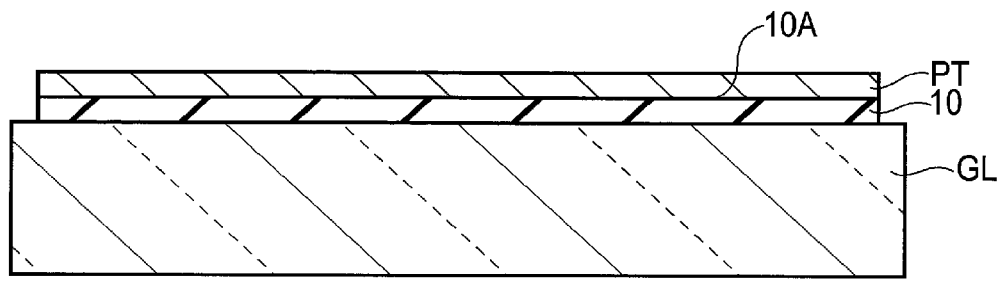
F I G. 6
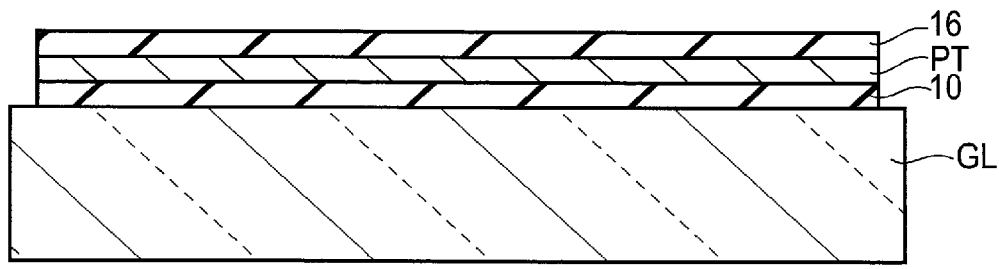
F I G. 7

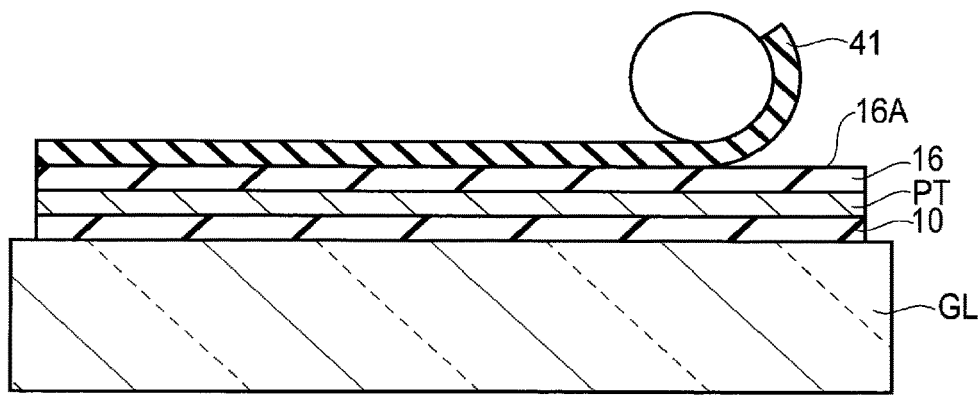
F I G. 8
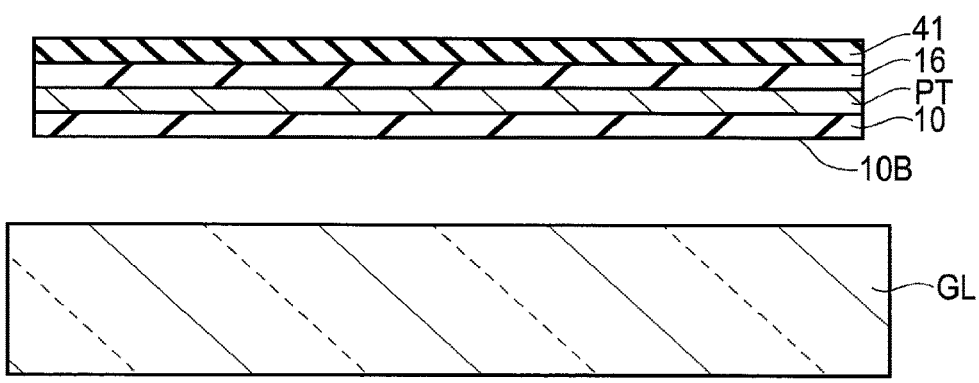
F I G. 9
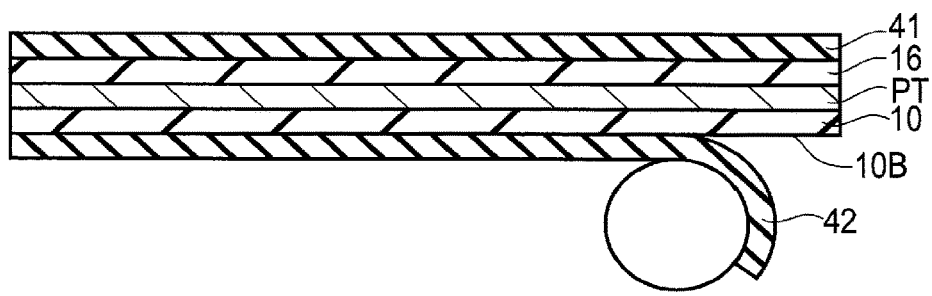
F I G. 10

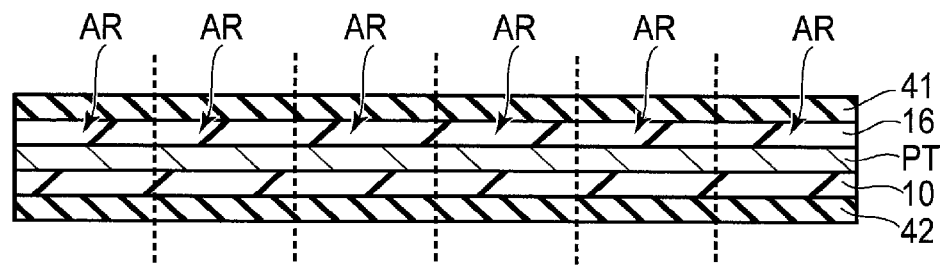
F I G. 11
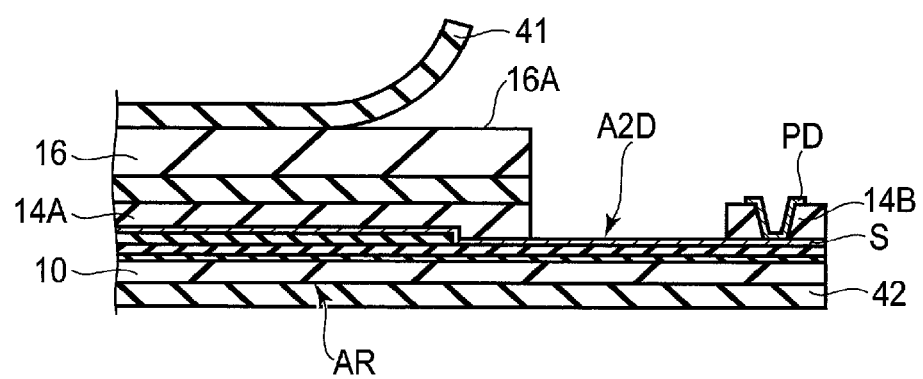
F I G. 12

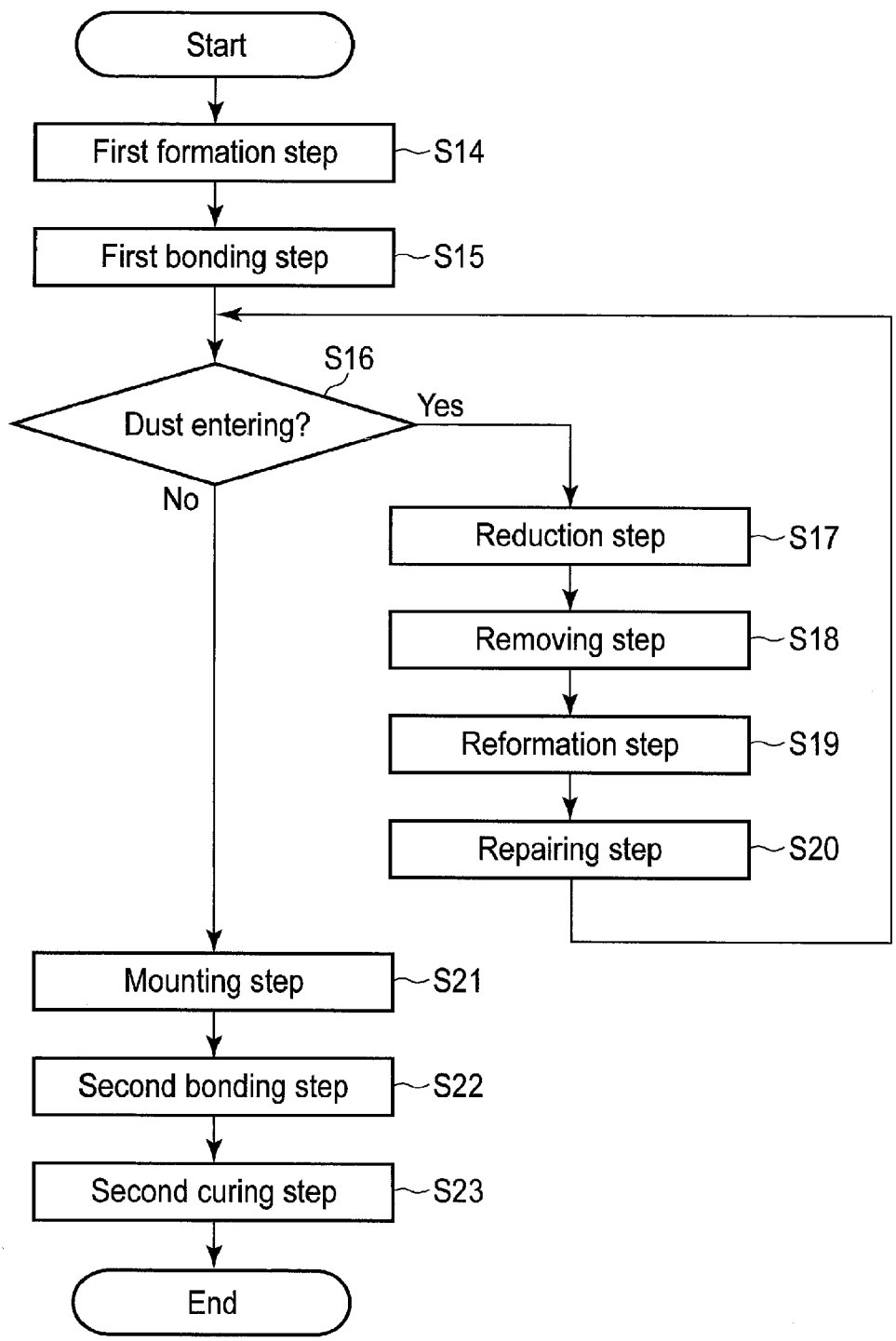
F I G. 13

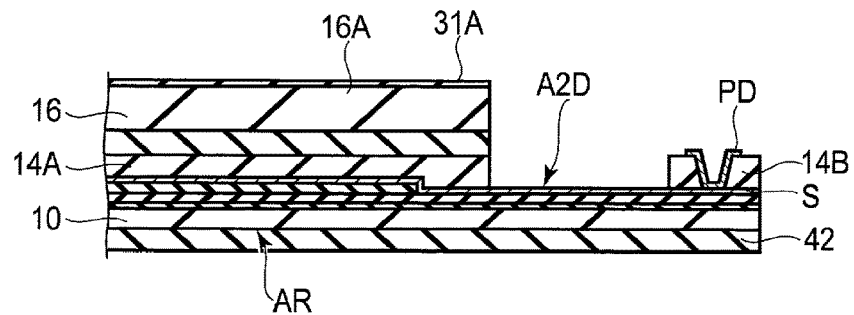
F I G. 14
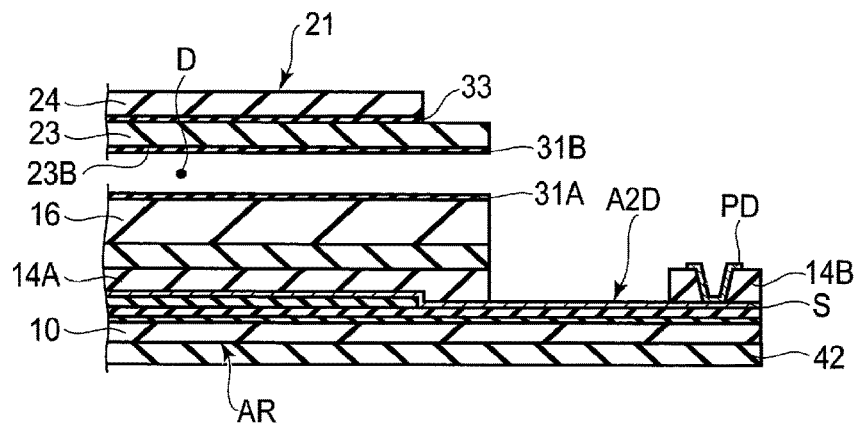
F I G. 15
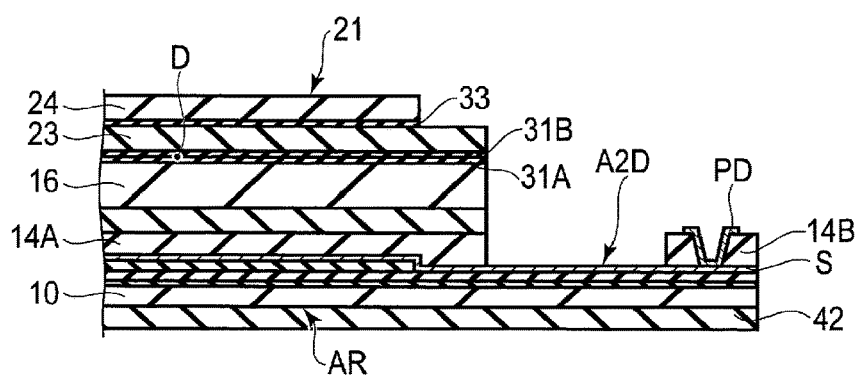
F I G. 16

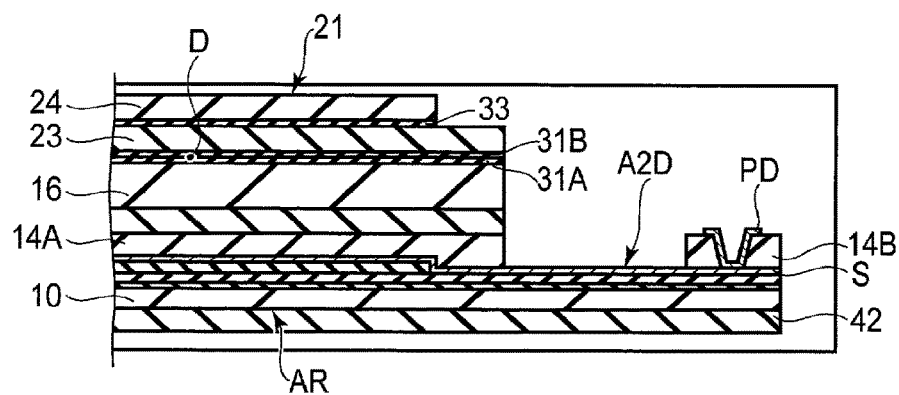
F I G. 17
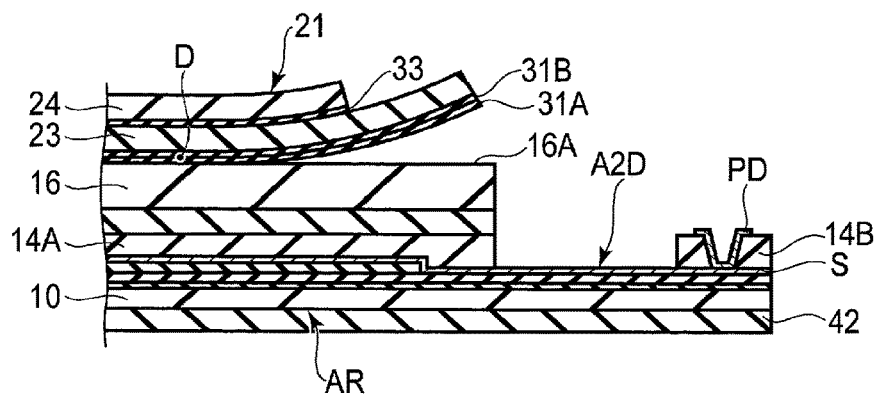
F I G. 18
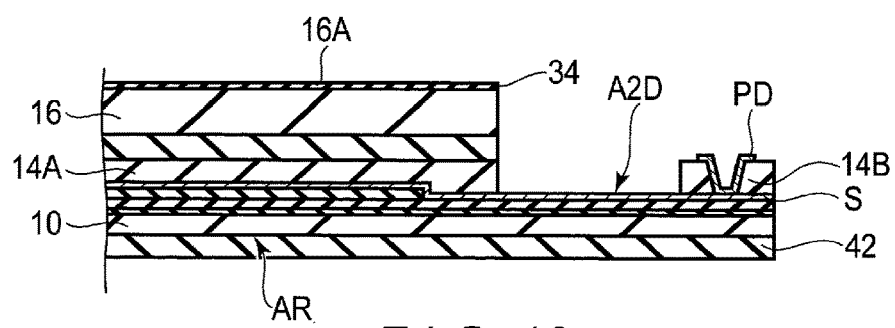
F I G. 19

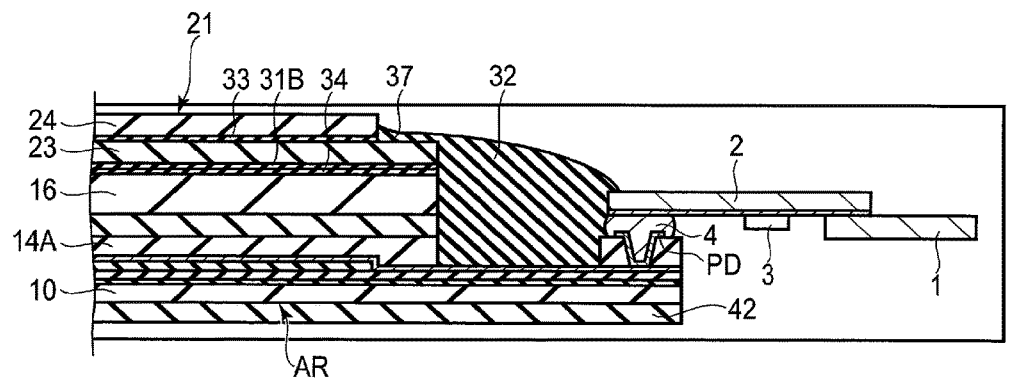
F I G. 23
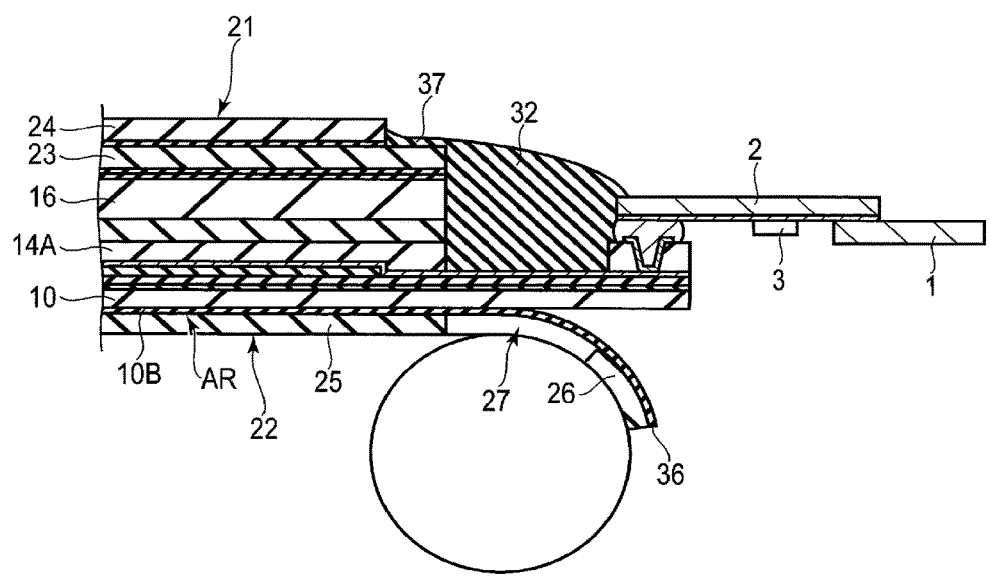
F I G. 24

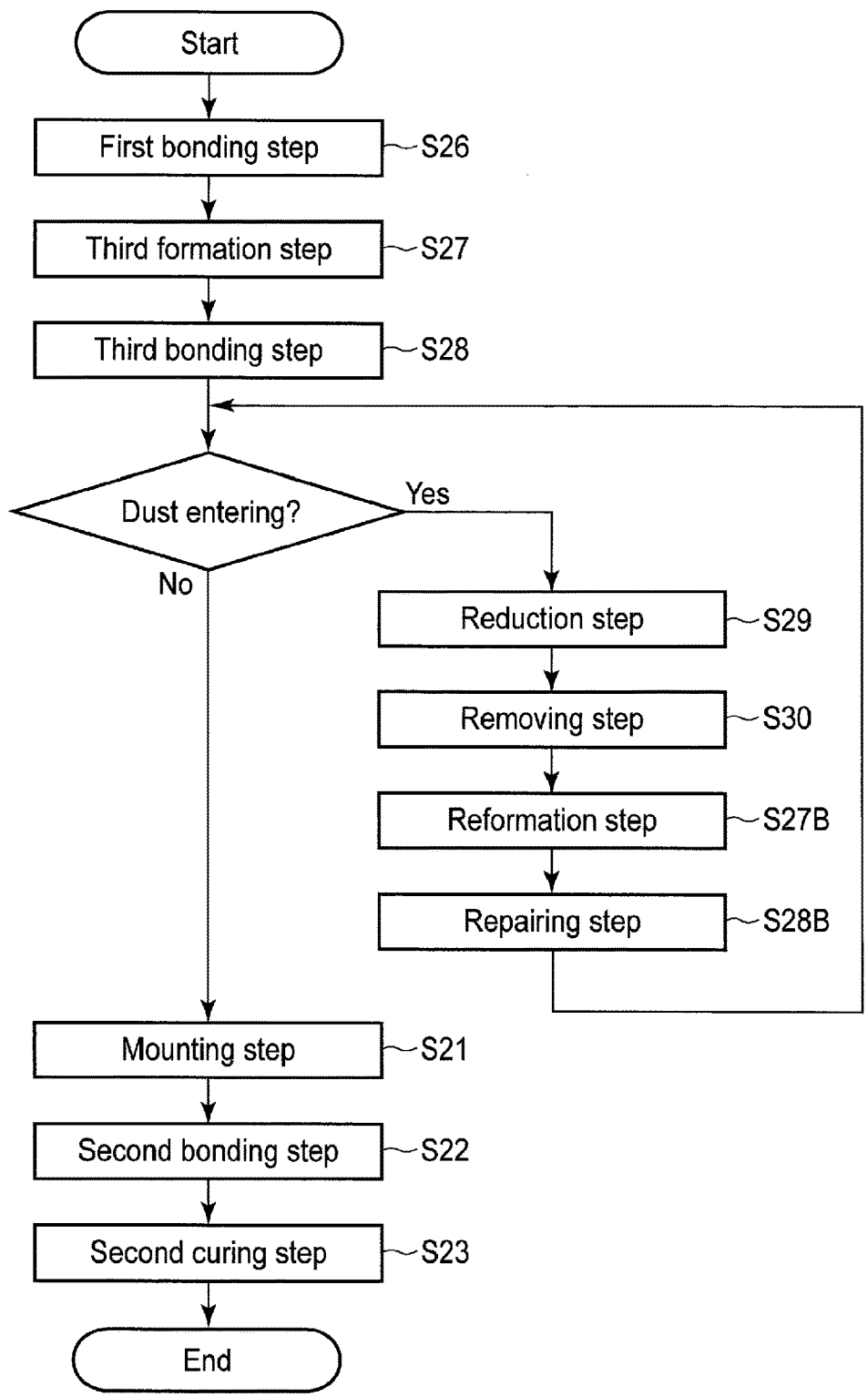
F I G. 25

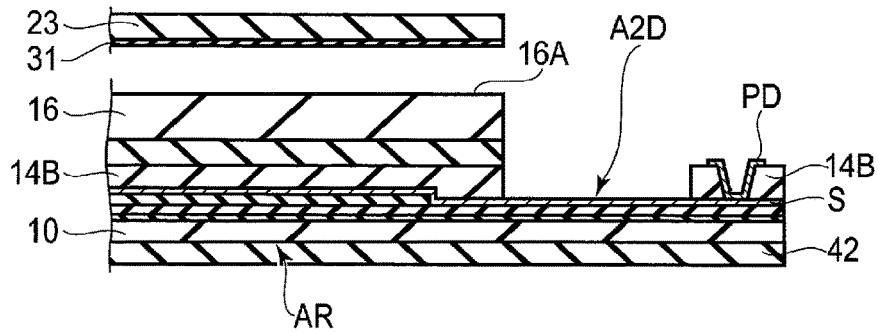
F I G. 26
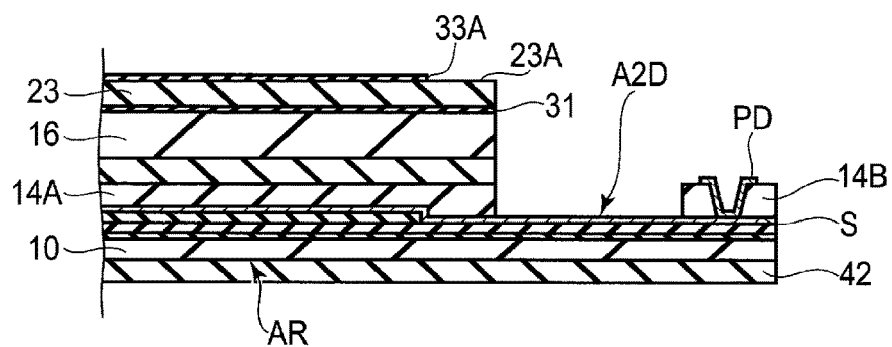
F I G. 27
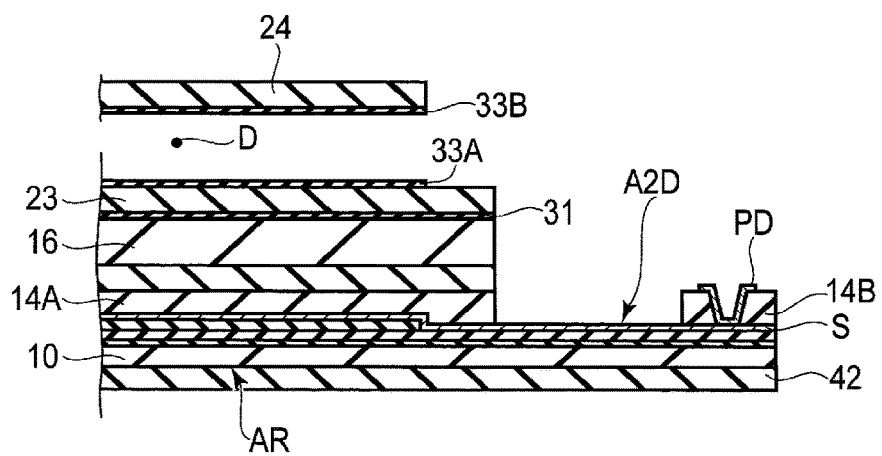
F I G. 28

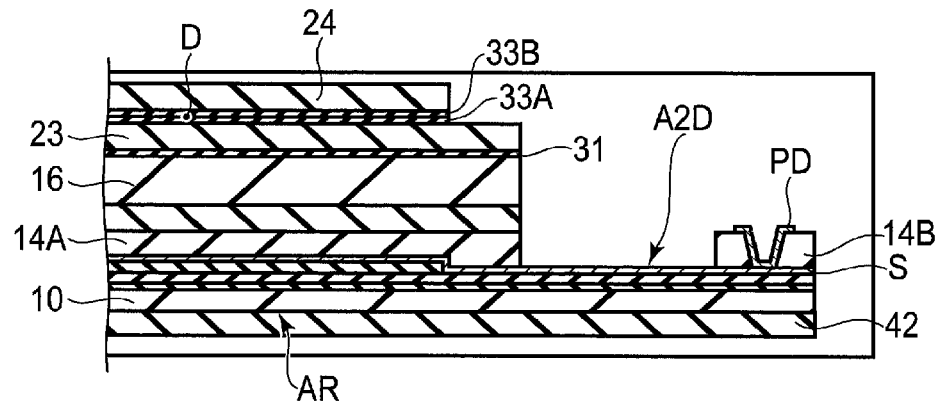
F I G. 29
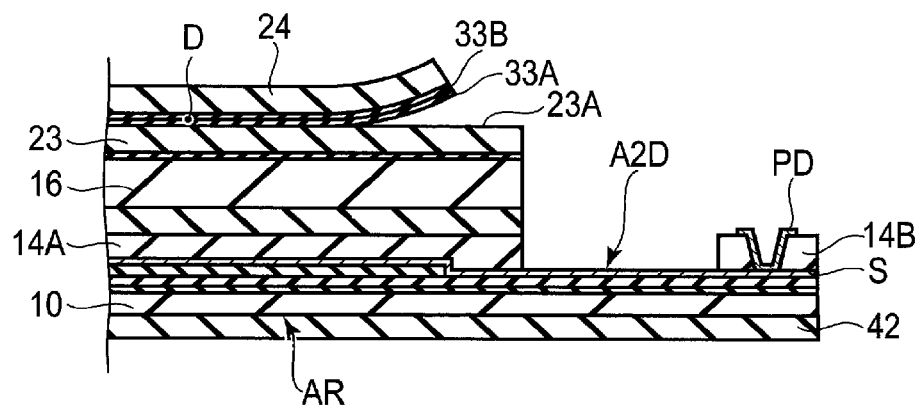
F I G. 30

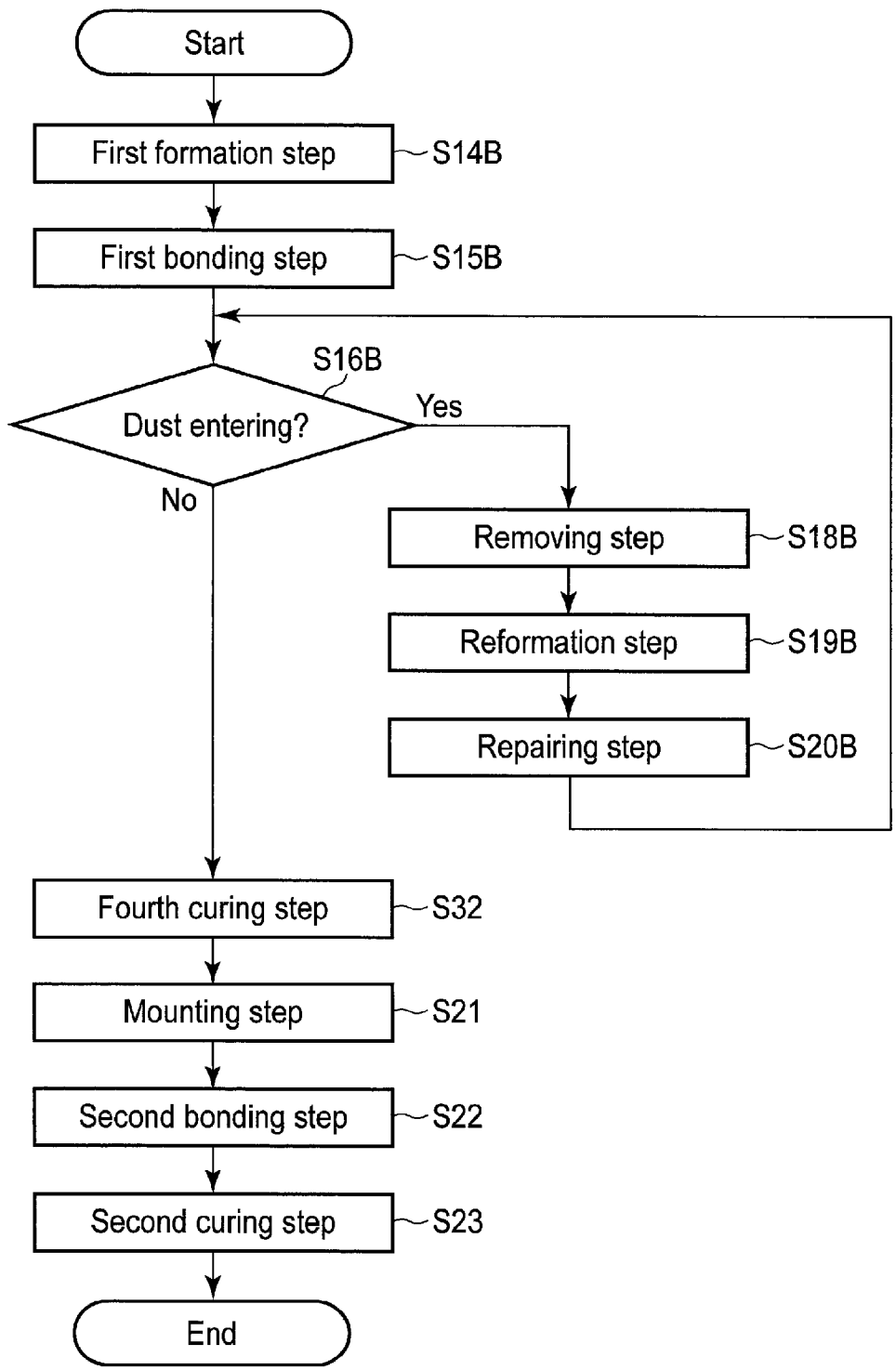
F I G. 32

DISPLAY DEVICE AND METHOD OF MANUFACTURING THE SAME

CROSS-REFERENCE TO RELATED APPLICATIONS

This application is based upon and claims the benefit of priority from Japanese Patent Application No. 2016-221748, filed Nov. 14, 2016, the entire contents of which are incorporated herein by reference.

FIELD

Embodiments described herein relate generally to a display device and a method of manufacturing the same.

BACKGROUND

In a display device using an organic or inorganic electroluminescent (EL) device or a light-emitting diode (LED) device, various films such as polarizers and support films are superposed. Dust may enter when the films are stuck. A requirement to peel off the films for repairing has been increased to improve the yields.

BRIEF DESCRIPTION OF THE DRAWINGS

FIG. 2 is a circuit diagram showing a circuit configuration of a pixel circuit according to the embodiments.

FIG. 3 is a cross-sectional view showing a configuration of a display area shown in FIG. 1.

FIG. 4 is a cross-sectional view showing a configuration of a drive area shown in FIG. 1.

FIG. 5 is a cross-sectional view for explanation of a method of manufacturing the display device shown in FIG. 1, illustrating preparation steps common to the embodiments.

FIG. 6 is a cross-sectional view for explanation of a light-emitting layer formation step of forming a pattern of an organic EL element, in the steps common to the embodiments.

FIG. 7 is a cross-sectional view for explanation of a protective film formation step of coating the organic EL element, in the steps common to the embodiments.

FIG. 8 is a cross-sectional view for explanation of a first curing step of protecting a front surface of a work, in the steps common to the embodiments.

FIG. 9 is a cross-sectional view for explanation of a laser liftoff step of peeling off a glass substrate, in the steps common to the embodiments.

FIG. 10 is a cross-sectional view for explanation of a second curing step of protecting a back surface of a work, in the steps common to the embodiments.

FIG. 11 is a cross-sectional view for explanation of a cell-cut step of dividing the work, in the steps common to the embodiments.

FIG. 12 is a cross-sectional view for explanation of a step of exposing an upper surface of a protective film, in the steps common to the embodiments.

FIG. 13 is a flowchart showing an example of a display device manufacturing method according to the first embodiment.

FIG. 14 is a cross-sectional view for explanation of a first formation step of forming a first adhesive layer in the display device manufacturing method according to the first embodiment.

FIG. 15 is a cross-sectional view for explanation of a first bonding step of bonding a first auxiliary base to the first adhesive layer in the display device manufacturing method according to the first embodiment.

FIG. 16 is a cross-sectional view for explanation of the first bonding step according to the first embodiment, subsequent to FIG. 15.

FIG. 17 is a cross-sectional view for explanation of a reducing step of reducing a bonding strength of the first adhesive layer in the display device manufacturing method according to the first embodiment.

FIG. 18 is a cross-sectional view for explanation of a removing step of peeling off the first auxiliary base from the protective film in the display device manufacturing method according to the first embodiment.

FIG. 19 is a cross-sectional view for explanation of a reformation step of forming a fourth adhesive layer in the display device manufacturing method according to the first embodiment.

FIG. 23 is a cross-sectional view for explanation of a second curing step of curing a second adhesive layer in the display device manufacturing method according to the first embodiment.

FIG. 24 is a cross-sectional view for explanation of a step of bonding a second auxiliary base in the display device manufacturing method according to the first embodiment.

FIG. 25 is a flowchart showing an example of a display device manufacturing method according to a second embodiment.

FIG. 26 is a cross-sectional view for explanation of a first bonding step of bonding a first auxiliary base to a first adhesive layer in the display device manufacturing method according to the second embodiment.

FIG. 27 is a cross-sectional view for explanation of a third formation step of forming a third adhesive layer in the display device manufacturing method according to the second embodiment.

FIG. 28 is a cross-sectional view for explanation of a third bonding step of bonding a polarizer to the third adhesive layer in the display device manufacturing method according to the second embodiment.

FIG. 29 is a cross-sectional view for explanation of a reducing step of reducing a bonding strength of the third adhesive layer in the display device manufacturing method according to the second embodiment.

FIG. 30 is a cross-sectional view for explanation of a removing step of peeling off the polarizer from a light transparent film in the display device manufacturing method according to the second embodiment.

FIG. 32 is a flowchart showing an example of a display device manufacturing method according to a third embodiment.

DETAILED DESCRIPTION

Figure 1:
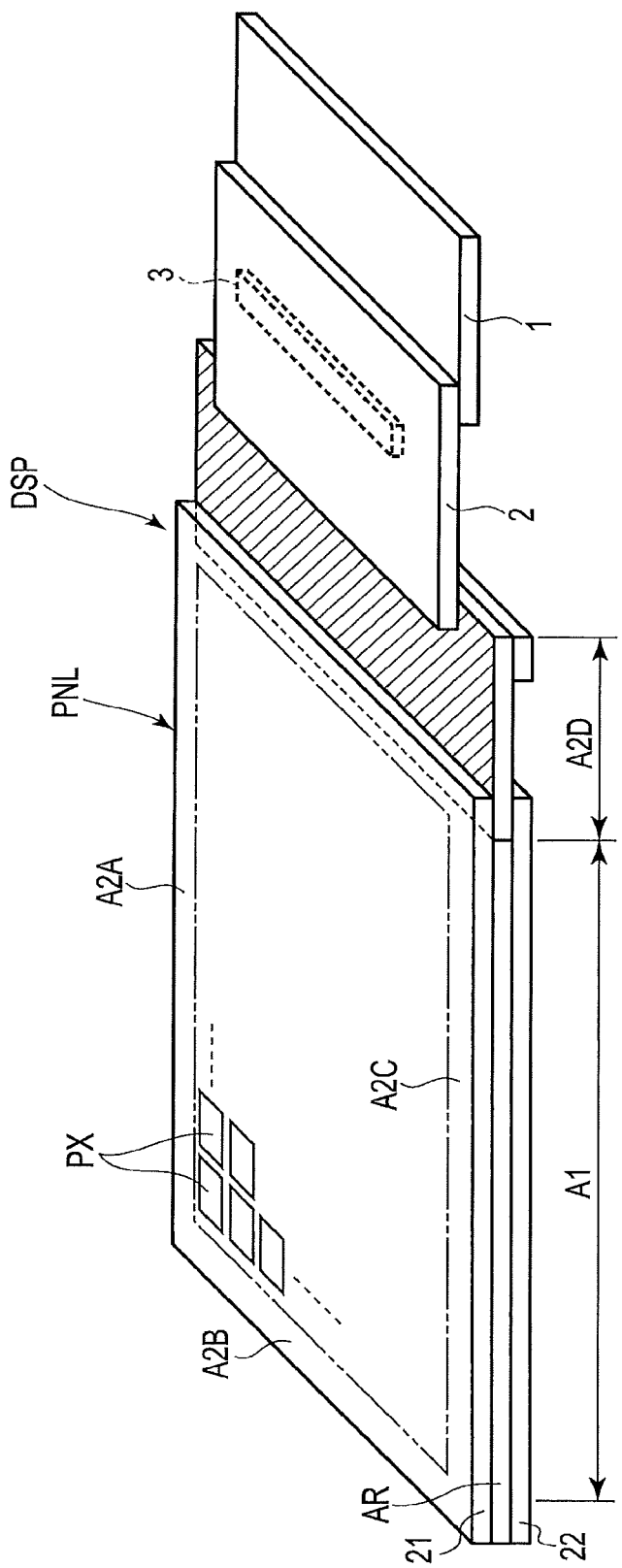
FIG. 1 is a perspective view showing a schematic configuration of a display device according to the embodiments.
Figure 1:
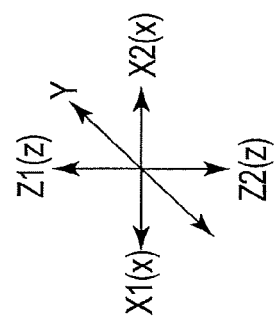

In general, according to one embodiment, a display device includes a first insulating substrate, an emitting layer, a protective film, a resin base, a first adhesive layer, and a second adhesive layer. The first insulating substrate includes a display area and a drive area. The emitting layer is in the display area. The protective film covers the emitting layer. The resin base is at a position upper than the protective film. The first adhesive layer is under the resin base, in the display area and the drive area. The second adhesive layer is on the resin base. The second adhesive layer covers the drive area and an end portion of the resin base. The resin base is located between the first adhesive layer and the second adhesive layer in the drive area.

In addition, according to another embodiment, a method of manufacturing a display device includes a preparation step, an emitting layer formation step, a protective film formation step, a first bonding step, a second bonding step. The preparation step prepares a first insulating substrate including a display area and a drive area. The emitting layer formation step forms an emitting layer in the display area. The protective film formation step forms a protective film covering the emitting layer. The first bonding step bonds a resin base to the first adhesive layer in the display area and the drive area. The second bonding step applies a second adhesive layer to the drive area and causes an end portion of the resin base to be sandwiched between the first adhesive layer and the second adhesive layer.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, and the like of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

In each of the embodiments, an organic EL display device DSP is disclosed as an example of the display device. The organic EL display device DSP can be used for, for example, various devices such as a smartphone, a tablet terminal, a mobile telephone terminal, a personal computer, a TV receiver, a vehicle-mounted device, a game console and a wearable terminal. An example of a display device using an organic emitting layer as a light emitting layer will be explained below. However, the present invention can be employed even if a light emitting layer of an inorganic EL device or a light emitting diode device is used.

FIG. 1 is a perspective view schematically showing a configuration of an organic EL display device DSP. The organic EL display device DSP comprises a display panel PNL, a first wiring board 1, and a second wiring board 2.

In each of the embodiments, a first direction X, a second direction Y and a third direction Z are defined as shown in FIG. 1. Furthermore, one of sides of the first direction X is defined as a first side X1 and the other side of the first direction X is defined as a second side X2, while one of sides of the third direction Z is defined as an upper side Z1 and the other side of the third direction Z is defined as a lower side Z2. The first direction X is, for example, a direction along a longer side of the display panel PNL. The second direction Y is, for example, a direction along a shorter side of the display panel PNL. The third direction Z is a direction intersecting the first direction X and the second direction Y. In the example illustrated in FIG. 1, the first to third directions X, Y, and Z are perpendicular to each other. The first to third directions X, Y, and Z may intersect at the other angle.

The display panel PNL includes a display area A1 on which an image is displayed and non-display areas A2 (A2A, A2B, A2C, and A2D) surrounding the display area A1 from four sides.

The non-display areas A2A and A2C extend along the longer sides of the display panel PNL and are opposed to each other. The non-display areas A2B and A2D extend along the shorter sides of the display panel PNL and are opposed to each other. The non-display area A2B is located more closely to the first side X1 than the display area A1 and the non-display area A2D is located more closely to the second side X2 than the display area A1.

The display panel PNL includes a plurality of pixels PX arrayed in a matrix in the first direction X and the second direction Y, in the display area A1. The pixel PX is a minimum unit constituting the color image and comprises organic EL devices OLED1, OLED2, and OLED3 which will be explained later.

The first wiring board 1 is, for example, a flexible printed circuit and is electrically connected to an external control module which supplies a signal to the display panel PNL based on the image data.

The second wiring board 2 is mounted on the second side X2 of the non-display area A2D to make electric connection between the display panel PNL and the wiring board 1. The second wiring board 2 is, for example, a Chip On Film (COF) package and a driver IC chip 3 which drives the display panel PNL is mounted on the second wiring board 2. The driver IC chip 3 may be mounted on the control module or the array substrate AR. Each of the driver IC chip 3 and the control module is an example of driver components. The non-display area A2D connected to the driver components is called a driver area A2D in the following explanations.

FIG. 2 is a circuit diagram showing a circuit configuration of a pixel circuit in the organic EL display device according to the embodiments. In FIG. 2, OLED denotes the organic EL device, an anode electrode of the organic EL device (OLED) is connected to a power line (POWER) via a driving transistor (DTr), and a cathode electrode of the organic EL device (OLED) is grounded. A storage capacitor (C) is connected between a gate electrode and a source electrode (or drain electrode) of the driving transistor (DTr). The gate electrode of the driving transistor (DTr) is connected to a video line (data) via a switching transistor (Tr). The gate electrode of the switching transistor (Tr) is also connected to a scanning line (SCAN). Each of the driving transistor (DTr) and the switching transistor (Tr) is composed of a polysilicon thin-film transistor.

FIG. 3 is a cross-sectional view showing the display panel PNL in the display area A1. As shown in FIG. 3, the display panel PNL comprises an array substrate AR, a first auxiliary base 21, and a second auxiliary base 22. The array substrate AR includes a first insulating substrate 10, switching elements SW1, SW2, and SW3, a reflective layer M, the organic EL devices OLED1, OLED2, and OLED3, and a protective layer 16. Each of the switching elements SW1, SW2, and SW3 corresponds to the driving transistor (DTr) shown in FIG. 2.

The switching elements SW2 and SW3 have approximately the same shapes and functions as the switching element SW1. For this reason, the switching element SW1 will be explained in detail as the representative, and duplicate explanations on the switching elements SW2 and SW3 may be omitted.

Similarly, the organic EL devices OLED2 and OLED3 have approximately the same shapes and functions as the organic EL device OLED1. For this reason, the organic EL device OLED1 will be explained in detail as the representative, and duplicate explanations on the organic EL devices OLED2 and OLED3 may be omitted.

Similarly, organic emitting layers ORG2 and ORG3 provided in the organic EL devices OLED2 and OLED3 respectively have approximately the same shapes and functions as an organic emitting layer ORG1 provided in the organic EL device OLED1. For this reason, the organic emitting layer ORG1 will be explained in detail as the representative, and duplicate explanations on the organic emitting layers ORG2 and ORG3 may be omitted.

The first insulating substrate 10 is formed of, for example, polyimide resin and includes a first surface 10A and a second surface 10B on a side opposed to the first surface 10A. The first surface 10A of the first insulating substrate 10 is covered with the first insulating film 11.

The switching elements SW1, SW2, and SW3 are formed on an upper side than the first insulating film 11. The switching element SW1 comprises a semiconductor layer SC formed on the first insulating film 11. The semiconductor layer SC and the first insulating film 11 are covered with the second insulating film 12. A gate electrode WG of the switching element SW1 is formed on the second insulating film 12 and provided on the semiconductor layer SC. The gate electrode WG and the second insulating film 12 are covered with the third insulating film 13. The first to third insulating films 11, 12, and 13 are formed of, for example, an inorganic material such as silicon oxide or silicon nitride.

A source electrode WS and a drain electrode WD of the switching element SW1 are provided on the third insulating film 13. The source electrode WS and the drain electrode WD are electrically connected to the semiconductor layer SC via contact holes which penetrate the second insulating film 12 and the third insulating film 13.

The switching element SW1 and the third insulating film 13 are covered with a fourth insulating film 14. The fourth insulating film 14 is formed of, for example, an acrylic organic film or a polyimide-based organic film. A reflective film M is provided on the fourth insulating film 14. The reflective film M is formed of, for example, a high-reflectance metallic material such as aluminum or silver. The surface of the reflective film M may be a flat surface or an uneven surface imparting the light scattering property.

Organic EL devices OLED1, OLED2, and OLED3 are provided on the fourth insulating film 14 to emit light beams of, for example, red (R), green (G), and blue (B), respectively. The organic EL device OLED1 comprises an anode (pixel electrode) PE1 and an organic emitting layer ORG1. Similarly, the organic EL device OLED2 comprises an anode PE2 and an organic emitting layer ORG2. The organic EL device OLED3 comprises an anode PE3 and an organic emitting layer ORG3.

Each of the organic EL devices OLED1, OLED2, and OLED3 further comprises a cathode (common electrode) CE. Each of the organic EL devices OLED1, OLED2, and OLED3 may further comprise a hole-transport layer and an electron-transport layer. The pixel electrode PE1 may be configured as a cathode and the common electrode CE may be configured as an anode. The pixel electrodes PE2 and PE3 are configured similarly. The pixel electrodes PE1, PE2, and PE3 and the common electrode CE are formed of, for example, a transparent, electrically conductive material such as indium tin oxide (ITO) or indium zinc oxide (IZO).

The anodes PE1, PE2, and PE3 are provided on a reflective layer M. The anode PE1 is brought into contact with the drain electrode WD of the switching element SW1 and the organic EL device OLED1 is thereby electrically connected to the switching element SW1. Similarly, the organic EL device OLED2 is electrically connected to the switching element SW2 by the anode PE2. The organic EL device OLED3 is electrically connected to the switching element SW3 by the anode PE3.

The organic emitting layer ORG1 is provided on the anode PE1. Similarly, the organic emitting layer ORG2 is provided on the anode PE2 and the organic emitting layer ORG3 is provided on the anode PE3. The organic emitting layers ORG1, ORG2, and ORG3 are partitioned by ribs 15. The organic emitting layers ORG1, ORG2, and ORG3 and the ribs 15 are covered with the cathodes CE.

The protective layer 16 seals the array substrate AR by covering the upper surfaces of the organic EL devices OLED1, OLED2, and OLED3. The protective layer 16 prevents entry of oxygen and moisture into the organic EL devices OLED1, OLED2, and OLED3 and suppresses degradation of the organic EL devices OLED1, OLED2, and OLED3. The protective layer 16 is composed of, for example, a stacked layer body of an organic film and an inorganic film.

The first auxiliary base 21 is bonded on an upper surface of the array substrate AR. The first auxiliary base 21 comprises an optically transparent film 23 and a polarizer 24. The first auxiliary base 21 may be a single layer of the optically transparent film 23 or a single layer of the polarizer 24 or an anti-glare film and the like may be further deposited on the layer. The first auxiliary base 21 and the optically transparent film 23 are examples of the resin base.

The second auxiliary base 22 is bonded to a lower surface of the array substrate AR. The second auxiliary base 22 is formed of, for example, resin such as polyethylene terephthalate (PET) and has strength larger than the first insulating substrate 10. The second auxiliary base 22 suppresses deformation of the display panel PNL and prevents entry of moisture, gas and the like into the first insulating substrate 10.

In the example illustrated in FIG. 3, the optically transparent film 23 is bonded to the upper surface of the protective film 16 by a first adhesive layer 31. The polarizer 24 is bonded to the upper surface of the optically transparent film 23 by a third adhesive layer 33. The second auxiliary base 22 is bonded to a second surface 10B of the first insulating substrate 10 by a sixth adhesive layer 36. Each of the adhesive layers (first to sixth adhesive layers 31, 32, 33, 34, 35, and 36) is formed of an adhesive. The adhesive in the present specification contains a tackiness agent (pressure-sensitive adhesive). The adhesive layers of the embodiments may be double-faced tapes in which film-shaped bases are coated with an adhesive, except for the second adhesive layer 32 to be explained later.

FIG. 4 is a cross-sectional view showing the display panel PNL in the drive area A2D. As shown in FIG. 4, the second auxiliary base 22 comprises a first portion 25 and a second portion 26 spaced apart from the first portion 25. The display panel PNL is configured to be bendable at a part (window 27) which is not supported by the second auxiliary base 22 between the first portion 25 and the second portion 26.

In the example illustrated in FIG. 4, the first insulating film 11, the second insulating film 12, and a signal line S to be explained later extend to an end surface 10E of the first insulating substrate 10. In contrast, the third insulating film 13, a first portion 14A of the fourth insulating film 14, the rib 15, the protective film 16, the optically transparent film 23, and the polarizer 24 do not extend to the end surface 10E of the first insulating substrate 10.

More specifically, end surfaces of the first portion 14A of the fourth insulating film 14, the rib 15, the protective film 16, and the optically transparent film 23 are located to be approximately flush with the end surface 25E of the first portion 25 of the second auxiliary base 22. The end surfaces of the third insulating film 13 and the polarizer 24 are located more closely to the first side X1 than the end surface 25E (end surfaces of the fourth insulating film 14, the rib 15, the protective film 16, and the optically transparent film 23).

An upper surface 23A of the optically transparent film 23 is exposed between an end surface 23E of the optically transparent film 23 and an end surface 24E of the polarizer 24. In other words, the resin base (first auxiliary base 21) comprises a step portion (upper surface 23A of the exposed optically transparent film 23) formed at a position lower than the upper surface of the resin base (upper surface 24A of the polarizer 24). A fixing portion 37 of a second adhesive layer 32 to be explained later is locked on the step portion of the resin base.

The signal line S is a control line or the like to control the power line, the video line and the scanning line and extends to the display area A1 to be electrically connected to the anodes PE1, PE2, and PE3. The signal line S is formed of, for example, a stacked layer body of titanium/aluminum/titanium and is disposed on the second insulating film 12 and the third insulating film 13.

The fourth insulating film 14 further includes a second portion (separated portion) 14B spaced apart from the first portion 14A, on the second side X2 of the first insulating substrate 10 supported by the second portion 26 of the second auxiliary base 22. A contact hole CH and a pad PD which penetrate to the signal line S are provided in the second portion 14B.

The pad PD is formed of, for example, the same material as the anodes PE1, PE2, and PE3 in the same step and covers an inner surface and a periphery of the contact hole CH. The signal line S and the pad PD are electrically connected through the contact hole CH. The signal line S and the pad PD do not need to be electrically connected through the contact hole CH. An electrode formed of the same material as the gate electrode WG in the same step may be provided and the signal line S and the pad PD may be electrically connected via the electrode, though not illustrated in the drawing.

The second wiring boar 2 is mounted on the pad PD. The pad PD and the second wiring board 2 are connected electrically and mechanically by, for example, an anisotropically conductive film 4. The anisotropically conductive film 4 is a film-shaped adhesive containing uniformly dispersed conductive particles.

Next, the second adhesive layer 32 will be explained. The second adhesive layer 32 is provided between the optically transparent film 23 and the second wiring board 2 to cover the drive area A2D partially. In the example illustrated in FIG. 3, the second adhesive layer 32 covers the signal line S and the second insulating film 12 between the first portion 14A and the second portion 14B of the fourth insulating film 14.

The second adhesive layer 32 further covers an end portion of the optically transparent film 23. In the drive area A2D, an end portion of the optically transparent film 23 is disposed to be sandwiched between the first adhesive layer 31 and the second adhesive layer 32. The end portion of the optically transparent film 23 includes the end surface 23E of the optically transparent film 23 and its periphery. The second adhesive layer 32 covers the end surface 23E of the optically transparent film 23 and at least a portion of the upper surface 23A of the optically transparent film 23.

In other words, the second adhesive layer 32 includes the fixing portion 37 mounted on the upper surface 23A of the optically transparent film 23. The fixing portion 37 supports the upper surface 23A of the optically transparent film 23 from the upper side Z1 and thereby fixes the position of the first auxiliary base 21 and prevents the first auxiliary base 21 from being detached from the protective film 16.

In the example illustrated in FIG. 4, the second adhesive layer 32 covers a part of the end portion 24E of the polarizer 24 and prevents the polarizer 24 from being detached from the optically transparent film 23. Furthermore, the second adhesive layer 32 covers at least a part of the upper surface 2A of the second wiring board 2 and prevents the second wiring board 2 from detached from the display panel PNL.

Next, a display device manufacturing method of the embodiments to manufacture the display device DSP will be explained. First, steps common to the embodiments will be explained with reference to FIG. 5 to FIG. 12.

In a preparatory step shown in FIG. 5, the first insulating substrate 10 is prepared. First, a glass substrate GL is prepared. The material of the first insulating substrate 10 is applied on the upper surface of the glass substrate GL. The applied material is processed to form the first insulating substrate 10 in a large size. For example, if a composition containing a polyamide acid is applied to the upper surface of the glass substrate GL and the substrate is heated at 300 to 500° C. to be imide, the first insulating substrate 10 of a polyimide film can be formed.

In steps shown in FIG. 6 and FIG. 7, a plurality of array substrates AR are formed on the upper surface of the first insulating substrate 10. In an emitting layer formation step shown in FIG. 6, a pattern PT including the organic EL devices OLED1, OLED2, and OLED3 which correspond to the array substrates AR respectively is formed on the upper surface of the first insulating substrate 10. In a protective film formation step shown in FIG. 7, the protective film 16 is formed on the upper surface of the organic EL devices OLED1, OLED2, and OLED3.

In a first curing step shown in FIG. 8, the first curing film 41 is stuck on an upper surface 16A (front surface side of the work) of the protective film 16. The first curing film 41 protects the protective film 16 and imparts rigidity to the protective film 16 to prevent the first insulating substrate 10 from being deformed, in the manufacturing steps.

In a laser lift-off step shown in FIG. 9, the glass substrate GL is peeled off from the first insulating substrate 10. If a laser beam is applied to the glass substrate GL from the lower side Z2, the second surface 10B of the first insulating substrate 10 absorbs the laser beam and is slightly decomposed. A cavity occurs in an interface between the glass substrate GL and the first insulating substrate 10, and the glass substrate GL is peeled off from the first insulating substrate 10. A sacrificial layer of resin, amorphous silicon or the like reducing the adhesive strength by laser light application may be formed between the glass substrate GL and the second surface 10B.

In a second curing step shown in FIG. 10, a second curing film 42 is stuck on the second surface 10B (back surface side of the work) of the first insulating substrate 10. The second curing film 42 protects the second surface 10B and imparts rigidity to the first insulating substrate 10 to prevent the first insulating substrate 10 from being deformed, in the manufacturing steps.

In a cell cut step shown in FIG. 11, the pattern PT is cut to fragment the array substrate AR. A lighting test and the like are executed for each of the fragmented array substrates AR and, as shown in FIG. 12, the first curing film 41 is peeled off to expose the upper surface 16A of the protective film 16. The array substrate AR is thereby completed. In each of the embodiments explained below, when the first auxiliary substrate 21, the second auxiliary substrate 22, the first wiring board 1 and the second wiring board 2 are mounted on the array substrate AR, the display device DSP shown in FIG. 1 is completed.

[First Embodiment]

A method of manufacturing the display device according to the first embodiment will be explained with reference to FIG. 13 to FIG. 24. The first adhesive layer 31 according to the first embodiment includes a first A adhesive layer 31A and a first B adhesive layer 31B. The first A adhesive layer 31A is formed of an adhesion-variable adhesive having the adhesion strength remarkably reduced by a specific operation. Examples of the specific operation are cooling, heating, ultraviolet radiation and the like.

FIG. 13 is a flowchart showing an example of a display device manufacturing method according to the first embodiment. As shown in FIG. 13, the display device manufacturing method according to the first embodiment comprises a first formation step (S14), a first bonding step (S15), a reduction step (S17), a removing step (S18), a reformation step (S19), and a repairing step (S20). In the first formation step (S14) shown in FIG. 14, the first A adhesive layer 31A is formed on the upper surface 16A of the protective film 16. The first A adhesive layer 31A may be applied if the layer is liquid or may be stuck if the layer is an adhesive tape. In the present embodiment, the first A adhesive layer 31A formed in the first formation step has adhesion.

In the first bonding step (S15) shown in FIG. 15, the first auxiliary base 21 is stuck on the upper surface of the first A adhesive layer 31A. The first auxiliary base 21 is, for example, an optically transparent film equipped with a polarizer and the optically transparent film 23 and the polarizer 24 are preliminarily bonded in a third bonding step. Next, the third bonding step will be explained in the second embodiment.

In the example illustrated in FIG. 15, the first B adhesive layer 31B is provided on the lower surface of the first auxiliary base 21 (lower surface 23B of the optically transparent film 23). The first B adhesive layer 31B is formed of, for example, a pressure-sensitive adhesive. The first B adhesive layer 31B may not be disposed but, instead, the first auxiliary base 21 may be stuck directly on the first A adhesive layer 31A. In addition, first auxiliary base 21 is bonded to the first A adhesive layer 31A by the first B adhesive layer 31B if the first B adhesive layer 31B is a single-faced tape but the first B adhesive layer 31B may not be disposed if the first A adhesive layer 31A is a double-faced tape.

In the first bonding step, as shown in FIG. 16, dust D often enters between the array substrate AR and the first auxiliary base 21. In this case, the first auxiliary base 21 is peeled off and stuck again in the steps S17 to S20 shown in FIG. 17 to FIG. 20.

First, the adhesion of the first A adhesive layer 31A is reduced in the reduction step (S17) shown in FIG. 17. If the first A adhesive layer 31A is a cool-off type layer having the adhesion reduced by cooling, the array substrate AR is cooled at a temperature lower than or equal to a switching temperature by placing a cooling plate on the array substrate AR or placing the array substrate AR in a refrigerator. Various temperatures can be selected as the switching temperature by a molecular design. The adhesion of the first A adhesive layer 31A cooled at a temperature lower than or equal to the switching temperature is smaller than a strength to collapse interfaces of the anode, the hole-transport layer, the organic emitting layer, the electron-transport layer, the cathode and the like constituting the organic EL device OLED. For example, if the adhesion of the first A adhesive layer 31A exceeds 0.3N/25 mm in 180° peeling adhesion conforming to JIS Z0237 (2000), the interfaces of the anode, the hole-transport layer, the organic emitting layer, the electron-transport layer, the cathode and the like may be collapsed.

In the present embodiment, the adhesion of the first adhesive layer 31A at the temperature lower than or equal to the switching temperature is, for example, 10% or less as compared with the adhesion at a normal temperature. In addition, the 180° peeling adhesion conforming to JIS Z0237 (2000) for polyimide in the first adhesive layer 31A at the temperature lower than or equal to the switching temperature is, for example, 0.15N/25 mm or below. Examples of the resin having its adhesion reduced by cooling are CS2325NA2, CS2325NA3, and CS2325NA4 (products of Nitta Corporation).

If the first A adhesive layer 31A is a warm-off type layer having the adhesion reduced by heating, the array substrate AR may be heated at a temperature higher than or equal to the switching temperature by placing a heating plate on the array substrate AR or placing the array substrate AR in a heating furnace. If the first A adhesive layer 31A is a layer having its adhesion reduced by ultraviolet light, ultraviolet light may be applied to the first A adhesive layer 31A. Design of the reduction step can be changed freely by selecting an adhesion-variable adhesive. Examples of the resin having its adhesion reduced by heating are WS5130C02, WS5130C10, WS5130C20, and WS5130C15 (products of Nitta Corporation). Examples of the resin having its adhesion reduced by ultraviolet light are Adwill E series (products of Lintec Corporation) and PET8420 (product of Dexerials Corporation). A frame surrounding the entire body in FIG. 17 indicates executing heating, cooling or ultraviolet irradiation.

In the removing step (S18) shown in FIG. 18, the first auxiliary base 21 is peeled off from the protective film 16 formed on the first insulating substrate 10. At this time, since the adhesion of the first A adhesive layer 31A is reduced, load on the organic EL devices OLED1, OLED2, and OLED3 can be suppressed to the minimum level.

In the reformation step (S19) shown in FIG. 19, the fourth adhesive layer 34 is formed on the upper surface 16A of the protective film 16 from which dust D is removed together with the first auxiliary base 21. The first A adhesive layer 31A may be reused as the fourth adhesive layer 34 instead of newly forming the fourth adhesive layer 34.

Figure 20:
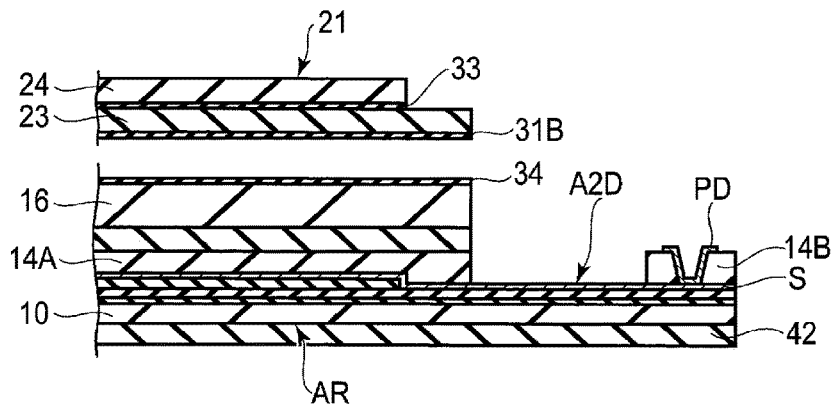
FIG. 20 is a cross-sectional view for explanation of a repairing step of bonding the first auxiliary base to a fourth adhesive layer in the display device manufacturing method according to the first embodiment.

In the repairing step (S20) shown in FIG. 20, the first auxiliary base 21 is bonded again on the protective film 16 formed on the first insulating substrate 10 by using the fourth adhesive layer 34. If dust enters again, the first auxiliary base 21 can be stuck again by repeating the steps shown in FIG. 17 to FIG. 20.

Figure 21:
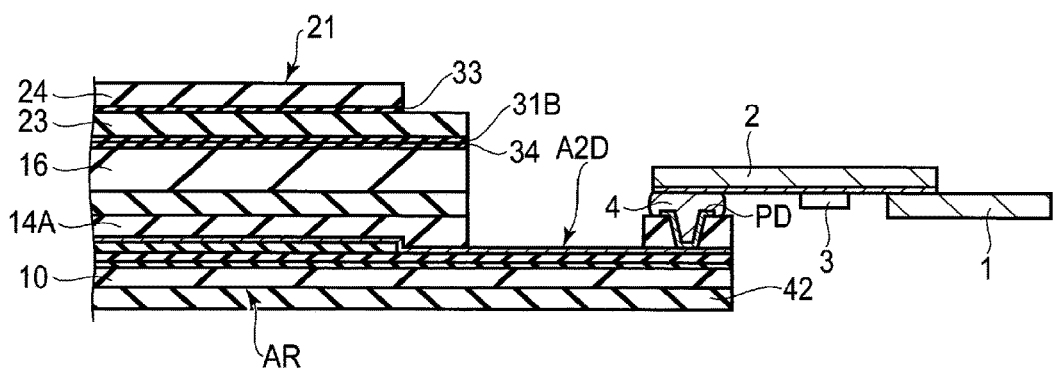
FIG. 21 is a cross-sectional view for explanation of a mounting step of mounting a second wiring substrate on the display panel in the display device manufacturing method according to the first embodiment.

In the mounting step (S21) shown in FIG. 21, the second wiring board 2 is mounted on the display panel PNL. The anisotropically conductive film 4 and the second wiring board 2 are disposed above the pad PD of the array substrate AR, pressed from the upper side of the second wiring board 2 and the lower side of the array substrate AR, and heated. The anisotropically conductive film 4 is thereby partially molten and the second wiring board 2 and the display panel PNL are connected electrically and mechanically.

Figure 22:
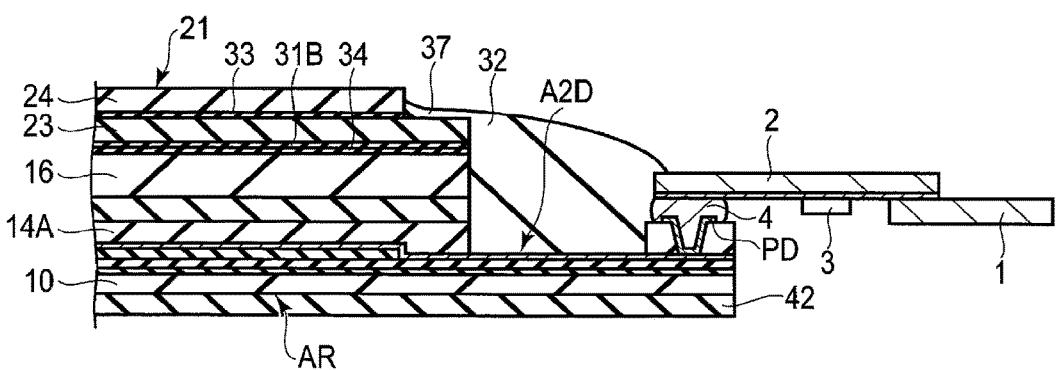
FIG. 22 is a cross-sectional view for explanation of a second bonding step of applying a second adhesive layer to a drive area in the display device manufacturing method according to the first embodiment.

In the second bonding step (S22) shown in FIG. 22, if the drive area A2D is filled with the second adhesive layer 32, the end portion of the optically transparent film 23 is sandwiched between the first adhesive layer 31 and the second adhesive layer 32. In the second curing step (S23) shown in FIG. 23, the formed second adhesive layer 32 is cured. The second adhesive layer 32 is cured by, for example, ultraviolet irradiation. A frame surrounding the entire body in FIG. 23 indicates executing ultraviolet irradiation.

The second curing film 42 on the back side of the work is peeled off to expose the second surface 10B of the first insulating substrate 10. As shown in FIG. 24, the second auxiliary base 22 is bonded on the second surface 10B (S24). The display device DSP according to the first embodiment is thereby completed.

According to the display device manufacturing method according to the first embodiment as explained above, the adhesion of the first adhesive layer 31 fixing the first auxiliary base 21 can be reduced by the operation such as cooling, and the resin base can be stuck again while suppressing damage to the organic EL devices OLED1, OLED2, and OLED3 to the minimum level.

The first auxiliary base 21 fixed on the first adhesive layer 31 is also fixed on the second adhesive layer 32 in a state in which the dust D does not enter. For this reason, detachment of the first auxiliary base 21 can be prevented even if the display device DSP is used in an environment in which the adhesion of the first adhesive layer 31 is reduced.

The upper surface 23A of the optically transparent film 23 locked by the first auxiliary base 21 and the second adhesive layer 32 is formed at a position lower than the upper surface 24A of the polarizer 24 on the first auxiliary base 21. For this reason, the thickness of the display panel PNL does not need to be increased even if the second adhesive layer 32 is disposed on the first auxiliary base 21.

Moreover, various preferable advantages can be obtained from the present embodiment.

Next, display device manufacturing methods according to the second to fourth embodiments will be explained. Constituent elements having functions which are the same as or similar to the above-explained constituent elements of the first embodiment are denoted by the same reference numerals with reference to the explanations of the first embodiment and their explanations are omitted. The steps other than those explained below are the same as the steps of the first embodiment.

[Second Embodiment]

A display device manufacturing method according to the second embodiment and its modified example will be explained with reference to FIG. 25 to FIG. 31. FIG. 25 is a flowchart showing an example of a display device manufacturing method according to the second embodiment. As shown in FIG. 25, the display device manufacturing method according to the second embodiment further comprises a third formation step and a third bonding step. The second embodiment is different from the first embodiment with respect to a feature that not a polarizer-equipped optically transparent film (first auxiliary base 21), but each of an optically transparent film 23 and a polarizer 24 is bonded to an array substrate AR as shown in FIG. 26 and FIG. 28.

A third adhesive layer 33 according to the second embodiment includes a third A adhesive layer 31A provided on an upper surface 23A of the optically transparent film 23 and a third B adhesive layer 31B provided on a lower surface 24B of the polarizer 24. The third A adhesive layer 31A is formed of an adhesion-variable adhesive having the adhesion reduced by a specific operation.

First, in a first bonding step (S26) shown in FIG. 26, the optically transparent film 23 is bonded on an upper surface 16A of a protective film 16 by a first adhesive layer 31. In the example illustrated in FIG. 24, the first adhesive layer 31 is formed of not an adhesion-variable adhesive, but a general adhesive. The first adhesive layer 31 may be formed of an adhesion-variable adhesive. In this case, an adhesion-variable adhesive having the adhesion reduced by an operation (for example, ultraviolet irradiation) different from a third A adhesive layer 33A is used.

In a third formation step (S27) shown in FIG. 27, the third A adhesive layer 33A is formed on the upper surface 23A of the optically transparent film 23. In a third bonding step (S28) shown in FIG. 28, the polarizer 24 is bonded to the optically transparent film 23 by the third adhesive layer 33 (third A adhesive layer 33A and third B adhesive layer 33B). The third B adhesive layer 33B may not be disposed.

In the third bonding step, dust D often enters between the optically transparent film 23 and the polarizer 24. In this case, the polarizer 24 is peeled off and stuck again in the steps shown in FIG. 27 to FIG. 30. First, the adhesion of the third A adhesive layer 33A is reduced in a reduction step (S29) shown in FIG. 29.

In a removing step (S30) shown in FIG. 30, the first auxiliary base 21 is peeled off from the optically transparent film 23 fixed on the first insulating substrate 10. At this time, the adhesion of the third A adhesive layer 33A is reduced, and load on organic EL devices OLED1, OLED2, and OLED3 can be suppressed to the minimum level. In a reformation step (S27B), a fifth adhesive layer 35 is formed on the upper surface 23A of the optically transparent film 23 exposed in a manner similar to the third formation step (S27). In a repairing step (S28B), the polarizer 24 is bonded to the fifth adhesive layer 35 formed on the optically transparent film 23 in a manner similar to the third bonding step (S28). Furthermore, the organic EL display device DSP is completed in the steps S21 to S23 similar to the first embodiment.

According to the second embodiment, the polarizer can be stuck again while suppressing damage to the organic EL devices OLED1, OLED2, and OLED3 to the minimum level. The bonded member fixed by the adhesive layer having a controllable adhesion is not limited to the resin bases such as the first auxiliary base 21 explained in the first embodiment or the polarizer 24 explained in the second embodiment.

Figure 31:
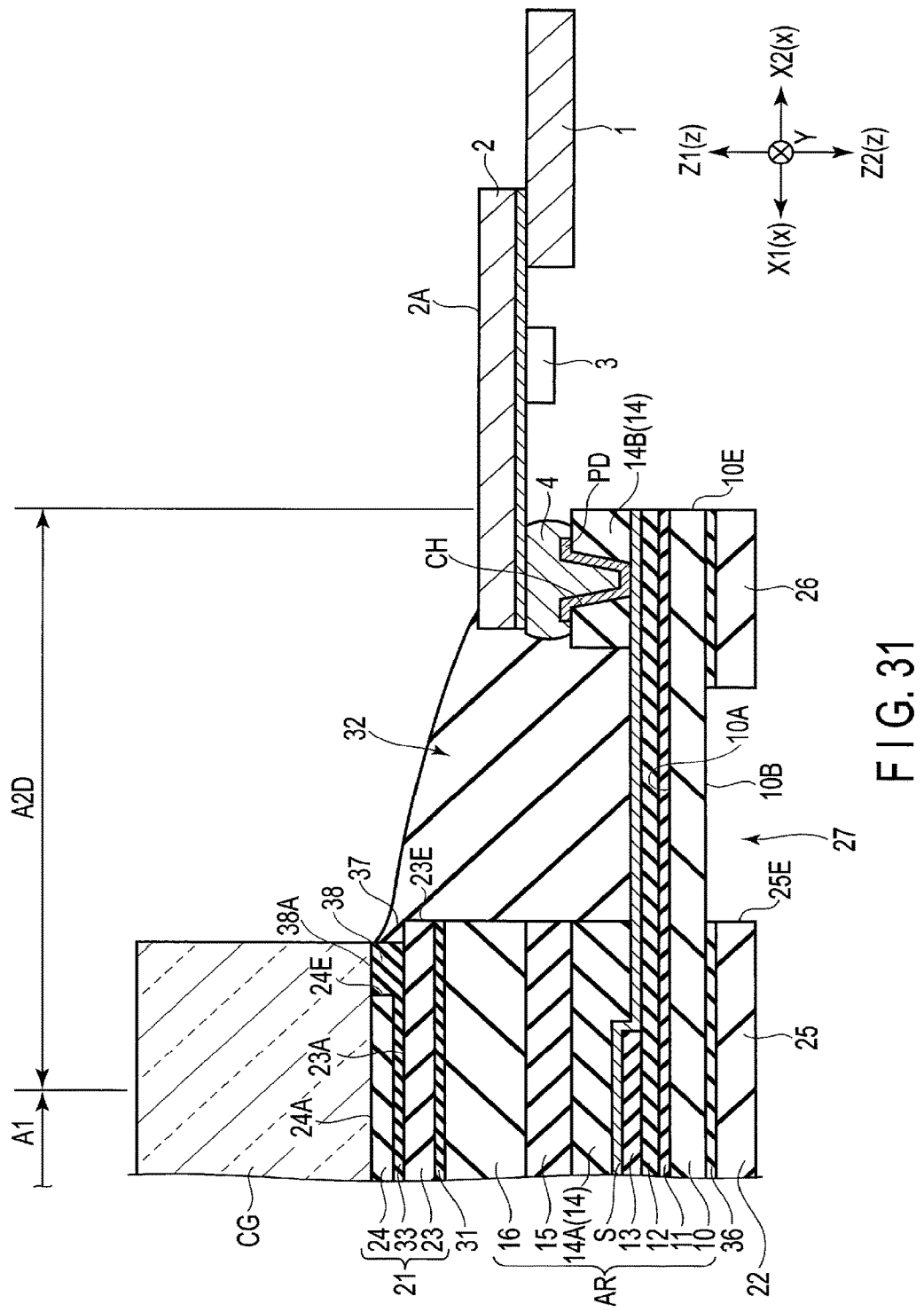
FIG. 31 is a cross-sectional view showing a modified example of the display device shown in FIG. 3.

FIG. 31 shows a modified example of the display device DSP according to the second embodiment. As shown in FIG. 31, for example, a cover glass CG covering the polarizer 24 may be fixed by the third adhesive layer 33. In the example illustrated in FIG. 31, the third adhesive layer 33 includes an expanding portion 38 located more closely to the second side X2 than the end surface 24E of the polarizer 24. An upper surface 38A of the expanding portion 38 is formed to be approximately flush with an upper surface 24A of the polarizer 24.

Similarly to the second embodiment, the cover glass CG can be stuck again while suppressing damage to the organic EL devices OLED1, OLED2, and OLED3 to the minimum level if the adhesion of the third adhesive layer 33 fixing the cover glass CG is reduced. Since the array substrate AR and the cover glass CG can be reused without being discarded, costs required to manufacture the display device DSP can be reduced.

[Third Embodiment]

A display device manufacturing method according to the third embodiment will be explained with reference to FIG. 32. The third embodiment is different from the first embodiment with respect to a feature of executing a first bonding step in a state in which the adhesion of a first adhesive layer 31 is weak. FIG. 32 is a flowchart showing an example of a display device manufacturing method according to the third embodiment. As shown in FIG. 32, the display device manufacturing method according to the third embodiment comprises a first curing step (S32) of curing a fourth adhesive layer 34 (first adhesive layer 31), in steps subsequent with confirmation of dust entry (S16B).

In a first formation step (S14B), the first adhesive layer 31 is formed on an upper surface 16A of a protective film 16. The third adhesive layer 31 in the third embodiment is formed of an adhesion-variable adhesive having a weak adhesion until cured. An example of the first adhesive layer 31 in the third embodiment is a thermosetting resin which exerts the adhesion if cured by the heat treatment. In the third embodiment, a first auxiliary base 21 is bonded to the first adhesive layer 31 in an uncured state.

In a first bonding step, dust D often enters between the protective film 16 and the first auxiliary base 21 (S16B). In this case, the first auxiliary base 21 is peeled off from the protective film 16 and the dust D is removed in a removing step (S18B). In the third embodiment, a reduction step is not executed to execute the removing step. The removing step can be executed directly after the first bonding step, similarly to the removing step (S18) shown in FIG. 18.

After the duct is removed, a fourth adhesive layer 34 similar to the first adhesive layer 31 is formed (S19B). The first adhesive layer 31 may be used as it is instead of forming the fourth adhesive layer 34. After that, the first auxiliary base 21 may be stuck again to the fourth adhesive layer 34 in a repairing step (S20B), similarly to the repairing step (S20) shown in FIG. 20. If the fourth adhesive layer 34 (first adhesive layer 31) is cured in a curing step (S32), the first auxiliary base 21 can be fixed on an array substrate AR.

In this case, ultraviolet light is hardly applied to the fourth adhesive layer 34 since the layer is located under a polarizer 21. In the present embodiment, however, the problem that ultraviolet light is hardly applied to the fourth adhesive layer 34 is not serious since the fourth adhesive layer 34 is formed of thermosetting resin. If a second adhesive layer 32 is also formed of thermosetting resin, the fourth adhesive layer 34 and the second adhesive layer 32 may be cured a simultaneously heating process.

According to the third embodiment, the first auxiliary base 21 can be stuck again while suppressing damage to the organic EL devices OLED1, OLED2, and OLED3 to the minimum level, similarly to the first embodiment. Furthermore, the adhesion of the first adhesive layer 31 is not reduced in the third embodiment. The reduction step shown in FIG. 16 can be omitted. Installations such as a refrigerator used in the reduction step are unnecessary.

[Fourth Embodiment]

A display device manufacturing method according to the fourth embodiment will be explained with reference to FIG. 33. The fourth embodiment is different from the third embodiment with respect to a feature of executing a third bonding step in a state in which the adhesion of a third adhesive layer 31 is weak, and simultaneously executing a third curing step of curing a third adhesive layer 33 and a second curing step of curing a second adhesive layer 32. The third adhesive layer 33 in the fourth embodiment is formed of an adhesion-variable adhesive having a weak adhesion until cured, similarly to the first adhesive layer 31 and the fourth adhesive layer 34 in the third embodiment.

Figure 33:
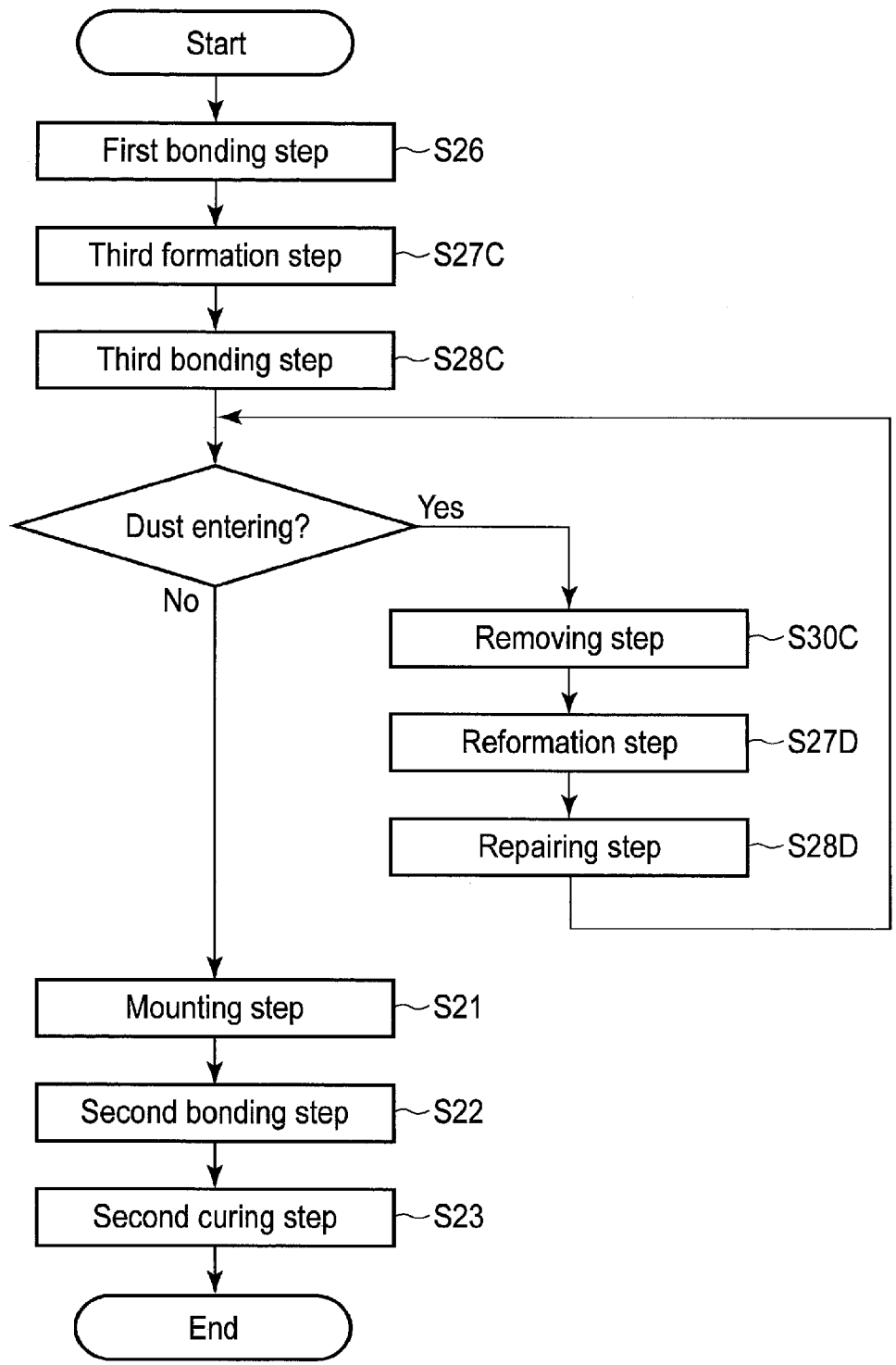
FIG. 33 is a flowchart showing an example of a display device manufacturing method according to a fourth embodiment.

FIG. 33 is a flowchart showing an example of a display device manufacturing method according to the fourth embodiment. In the fourth embodiment, a third bonding step is executed in a state in which a third adhesive layer 33 is not cured. After that, a second adhesive layer 32 and a third adhesive layer 33 are cured simultaneously in the second curing step shown in FIG. 22.

In the fourth embodiment, if dust D enters between an optically transparent film 23 and a polarizer 24 in a third bonding step (S28C), the dust is removed in a removing step (S30C). At this time, a reducing step can be omitted and dust can be removed since the third adhesive layer 33 is not cured. After that, a repairing step (S28D) is executed in a state in which the third adhesive layer 33 is not cured, and the second bonding step shown in FIG. 22 is executed. After that, a third curing step of curing a third adhesive layer 33 and a second curing step of curing a second adhesive layer 32 are executed simultaneously.

According to the fourth embodiment, the polarizer 24 can be stuck again while suppressing damage to the organic EL devices OLED1, OLED2, and OLED3 to the minimum level, similarly to the second embodiment. Furthermore, the adhesion of the third adhesive layer 33 does not need to be reduced to execute a removing step, in the fourth embodiment. Moreover, since the second adhesive layer 32 and the third adhesive layer 33 are cured simultaneously, the steps can be reduced and energy can be saved. The number of times of ultraviolet irradiation and heating for curing the second adhesive layer 32 and the third adhesive layer 33 can be reduced and damage to the organic EL devices OLED1, OLED2, and OLED3 can be suppressed to the minimum level.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the organic emitting layer may be configured to emit white light and a color filter may be provided on the array substrate and the resin base at a position corresponding to the organic emitting layer. A color converting layer may be provided instead of the color filter. For example, the switching element is configured as the top-gate thin-film transistor but may be configured as a bottom-gate thin-film transistor. For example, the organic EL device is configured as a top-emission device which emits light upwardly but may be configured as a bottom-emission device which emits light downwardly.

What is claimed is:

1. A display device comprising:
a first insulating substrate including a display area and a drive area;
an emitting layer in the display area;
a protective film covering the emitting layer;
a resin base at a position upper than the protective film;
a first adhesive layer under the resin base, in the display area and the drive area;
a second adhesive layer on the resin base; and
a polarizer provided at a position upper than the resin base,
the second adhesive layer covering the drive area and an end portion of the resin base,
the resin base being located between the first adhesive layer and the second adhesive layer in the drive area, wherein
the resin base is a light transmitting film,
a third adhesive layer is located between the polarizer and the light transmitting film,
the drive area includes a first side connected to the emitting layer and a second side connected to a drive component driving the emitting layer, and
an end portion of the light transmitting film is located more closely to the second side than an end portion of the polarizer.

2. The display device of claim 1, wherein
an adhesive strength of the first adhesive layer is reduced by cooling, heating or ultraviolet irradiation.

3. The display device of claim 2, wherein a material of the first adhesive layer is a thermosetting resin.

4. The display device of claim 1, wherein a material of the first adhesive layer is a thermosetting resin.

5. A method of manufacturing a display device, comprising:
a preparation step of preparing a first insulating substrate including a display area and a drive area;
an emitting layer formation step of forming an emitting layer in the display area, wherein the drive area includes a first side connected to the emitting layer and a second side connected to a drive component driving the emitting layer;
a protective film formation step of forming a protective film covering the emitting layer;
a first bonding step of bonding a resin base to the first adhesive layer in the display area and the drive area, wherein the resin layer is a light transmitting film;
a second bonding step of applying a second adhesive layer to the drive area and causing an end portion of the resin base to be sandwiched between the first adhesive layer and the second adhesive layer; a polarizer provided at a position upper than the resin base; and
a third bonding step of bonding the polarizer to the resin base by a third adhesive layer located between the polarizer and the light transmitting film, wherein an end portion of the light transmitting film is formed more closely to the second side than an end portion of the polarizer.

6. The method of claim 5, further comprising:
a reduction step of reducing adhesion of the first adhesive layer before the second bonding step and after the first bonding step;
a removing step of peeling off the resin base from the first insulating substrate after the reduction step; and
a repairing step of bonding the resin base to the first insulating substrate again by a fourth adhesive layer.

7. The method of claim 6, further comprising:
a repairing step of peeling off the resin base from the first insulating substrate after the first bonding step; and
a fourth curing step of curing the fourth adhesive layer after the repairing step.

8. The method of claim 7, further comprising:
a second curing step of curing the second adhesive layer after the second bonding step,
wherein
the second bonding step is executed after the repairing step.

9. The method of claim 8, wherein
the third bonding step is executed not before the first bonding step but after the first bonding step, and
the third adhesive layer and the second adhesive layer are cured simultaneously in the second curing step.

* * * * *